(12) United States Patent
Wu

(10) Patent No.: US 11,557,598 B2
(45) Date of Patent: Jan. 17, 2023

(54) NON-VOLATILE MEMORY AND FORMING METHOD THEREOF

(71) Applicant: UNITED MICROELECTRONICS CORP., Hsin-Chu (TW)

(72) Inventor: Tsung-Lin Wu, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/573,578

(22) Filed: Jan. 11, 2022

(65) Prior Publication Data

US 2022/0130848 A1    Apr. 28, 2022

Related U.S. Application Data

(62) Division of application No. 16/747,484, filed on Jan. 20, 2020, now Pat. No. 11,257,837.

(30) Foreign Application Priority Data

Jan. 3, 2020 (CN) .......................... 202010005372.9

(51) Int. Cl.

| H01L 27/11568 | (2017.01) |
| H01L 27/11565 | (2017.01) |
| H01L 29/423 | (2006.01) |
| H01L 21/28 | (2006.01) |

(52) U.S. Cl.
CPC .. *H01L 27/11568* (2013.01); *H01L 27/11565* (2013.01); *H01L 29/40117* (2019.08); *H01L 29/42376* (2013.01)

(58) Field of Classification Search
CPC ......... H01L 27/11568; H01L 27/11565; H01L 29/40117; H01L 29/42376; H01L 27/11563; H01L 29/792
See application file for complete search history.

(56) References Cited

U.S. PATENT DOCUMENTS

| 5,793,068 | A | 8/1998 | Mahant-Shetti |
| 6,686,300 | B2 | 2/2004 | Mehrotra |
| 7,023,032 | B1 | 4/2006 | Doyle |
| 10,163,922 | B2 * | 12/2018 | Abe ................. H01L 27/11573 |

* cited by examiner

*Primary Examiner* — Allison Bernstein
(74) *Attorney, Agent, or Firm* — Winston Hsu

(57) ABSTRACT

A non-volatile memory includes a substrate, a plurality of gate stacked strips and a plurality of contact plugs. The substrate includes a plurality of diffusion strips. The plurality of gate stacked strips are disposed over the diffusion strips, wherein each of the gate stacked strips includes a charge storage layer and a gate conductor layer stacked from bottom to top. The plurality of contact plugs are disposed on the diffusion strips between the gate stacked strips, wherein a sidewall of each of the gate conductor layer beside the contact plugs and above the diffusion strips has a step profile.

9 Claims, 5 Drawing Sheets

NON-VOLATILE MEMORY AND FORMING METHOD THEREOF

CROSS REFERENCE TO RELATED APPLICATIONS

This application is a division of U.S. application Ser. No. 16/747,484, filed on Jan. 20, 2020. The content of the application is incorporated herein by reference.

BACKGROUND OF THE INVENTION

1. Field of the Invention

The present invention relates generally to a non-volatile memory and forming method thereof, and more specifically to a non-volatile memory having step-profile gates and forming method thereof.

2. Description of the Prior Art

There are many types of non-volatile memory. Flash memory is the most popular type, and other types may include silicon-oxide-nitride-oxide-silicon (SONOS), ferroelectric random access memory (FRAM), phase-change random access memory (PRAM), magnetoresistive access memory (MRAM) and resistive random access memory (RRAM). FLASH, SONOS and FRAM are charge storage memory, which are operated by charging and discharging capacitors.

For example, by applying silicon-oxide-nitride-oxide-silicon (SONOS) as data storage units, one transistor can store two bits at the same time. This can shrink the sizes of components and improve memory capacity. When a SONOS memory is programmed, charge is transferred from a substrate to a silicon nitride layer of an ONO layer. For example, as a voltage difference is applied between a gate and a drain, a vertical electric field and a lateral electric field are built, and thus the speed of electrons along a gate channel increases. When the electrons move along the channel, some of these electrons tunnel through the bottom of the ONO layer and are trapped in the silicon nitride layer of the ONO layer. Because the largest electric field occurs near the drain, most electrons are trapped in the drain. In contrast, when a reverses voltage difference is applied between a source and a drain, the electrons move along an opposite direction, and are injected into the silicon nitride layer near the source. Since the silicon nitride layer is non-conductive, these charges injected into the silicon nitride layer are restricted in localized areas. Therefore, charges can be stored in different regions of one single silicon nitride layer, depending on the applied voltage.

SUMMARY OF THE INVENTION

The present invention provides a non-volatile memory and forming method thereof, which forms gate conductor layers having step-profiles, to increase distances between parts of the gate conductor layers and the contact plugs, thereby avoiding short circuits and reducing critical dimensions of elements.

The present invention provides a non-volatile memory including a substrate, a plurality of gate stacked strips and a plurality of contact plugs. The substrate includes a plurality of diffusion strips. The plurality of gate stacked strips are disposed over the diffusion strips, wherein each of the gate stacked strips includes a charge storage layer and a gate conductor layer stacked from bottom to top. The plurality of contact plugs are disposed on the diffusion strips between the gate stacked strips, wherein a sidewall of each of the gate conductor layer beside the contact plugs and above the diffusion strips has a step profile.

The present invention provides a method of forming a non-volatile memory including the following steps. A substrate including a plurality of diffusion strips is provided. A plurality of patterned gate stacked strips are formed over the diffusion strips, wherein each of the patterned gate stacked strips includes a charge storage layer and a first gate conductor layer stacked from bottom to top. A dielectric layer covers the patterned gate stacked strips and the substrate, wherein the dielectric layer has recesses exposing only first parts of the first gate conductor layers on the diffusion strips. Second gate conductor layers fill into the recesses, to form a plurality of gate conductor layers, wherein a sidewall of each of the gate conductor layers includes a step profile. The dielectric layer is removed. A plurality of contact plugs are formed on the diffusion strips between the step profiles of the gate conductor layers.

According to the above, the present invention provides a non-volatile memory and forming method thereof, which provides a substrate including a plurality of diffusion strips; forms a plurality of gate stacked strips over the diffusion strips, wherein each of the gate stacked strips includes a charge storage layer and a first gate conductor layer stacked from bottom to top; forms a plurality of contact plugs on the diffusion strips between the gate stacked strips, wherein a sidewall of each of the gate conductor layer on the diffusion strips and beside the contact plugs has a step profile. By doing this, distances between the contact plugs and upper parts of the gate conductor layers can be increased. Thereby, short circuits caused by the contacting of the contact plugs and the gate conductor layers can be avoided. This reduces critical dimensions of elements, increases stability of components, has more flexible layouts and increases processing windows. Besides, impurities doped into the substrate right below the gate conductor layers and the charge storage layers can be avoided, to prevent performance of components from being degraded.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
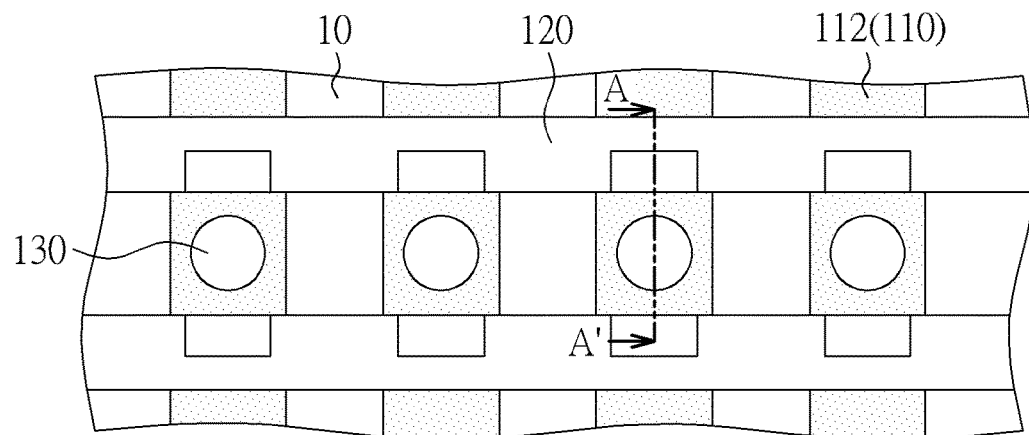
FIG. 1 schematically depicts a top view of a non-volatile memory according to an embodiment of the present invention.
Figure 2:
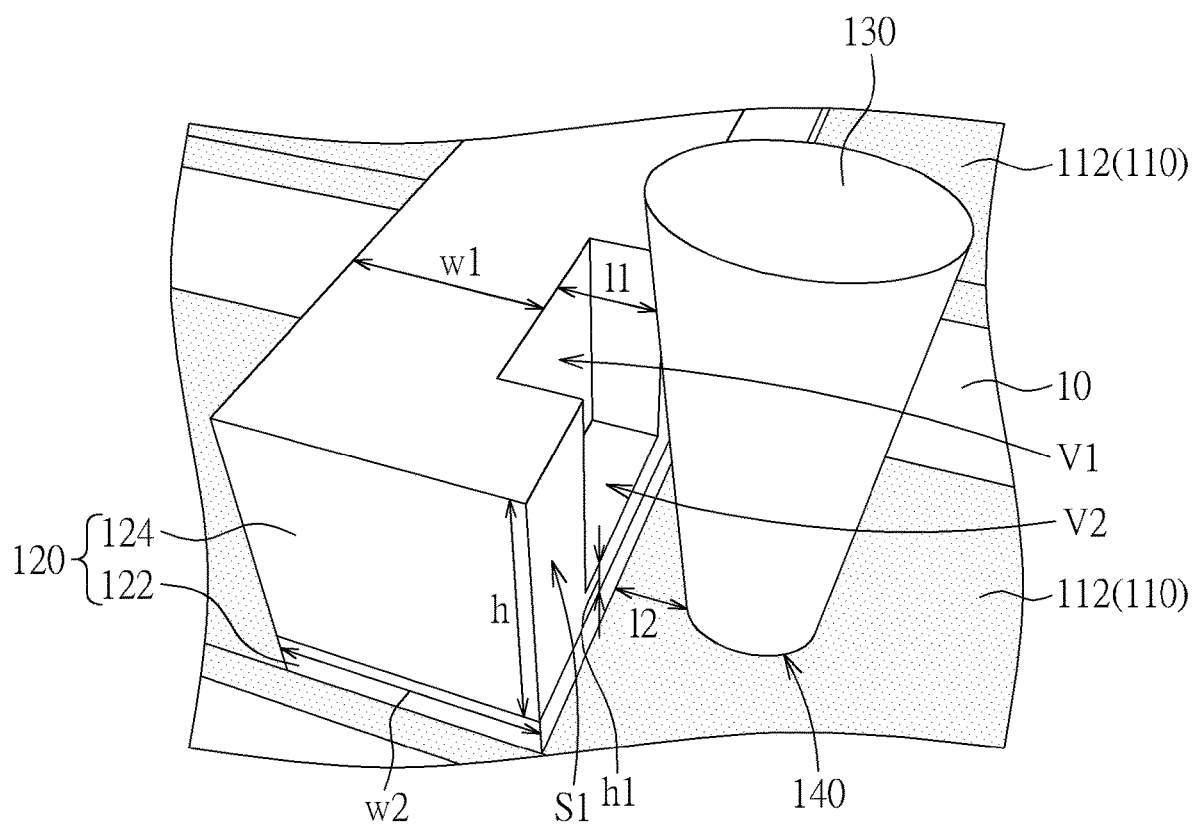
FIG. 2 schematically depicts a three-dimensional diagram of a part of a non-volatile memory according to an embodiment of the present invention.

FIG. 1 schematically depicts a top view of a non-volatile memory according to an embodiment of the present invention. FIG. 2 schematically depicts a three-dimensional diagram of a part of a non-volatile memory according to an embodiment of the present invention. Please refer to FIGS. 1-2, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. The substrate 110 may include a plurality of diffusion strips 112. Each of the diffusion strips 112 can be isolated by isolation structures 10. The isolation structures 10 may be shallow trench isolation (STI) structures, which may be a shallow trench isolation (STI) process, but it is not limited thereto.

A plurality of gate stacked strips 120 are located on the substrate 110 and over the diffusion strips 112. Each of the gate stacked strips 120 includes a charge storage layer 122 and a gate conductor layer 124 stacked from bottom to top. In this embedment, the charge storage layer 122 is an oxide/nitride/oxide (ONO) layer and the gate conductor layer 124 is a polysilicon layer. In other embodiments, the charge storage layer 122 and the gate conductor layer 124 may be other materials, depending upon practical requirements.

A plurality of contact plugs 130 are disposed on the diffusion strips 112 between the gate stacked strips 120. Each of the contact plugs 130 may include a barrier layer (not shown) surrounding a metal (not shown), wherein the barrier layer may include titanium nitride, and the metal may include copper or tungsten etc. Preferably, the contact plugs 130 have taper cross-sectional profiles broaden from bottom to top; still preferably, the contact plugs 130 have cone shapes, enabling the barrier layers and the metal filling into contact holes for forming the contact plugs 130 easily. Source regions (or drain regions) 140 are disposed in the diffusion strips 112 right below the contact plugs 130.

As shown in FIG. 2, a sidewall S1 of each of the gate conductor layer 124 on the diffusion strips 112 and beside the contact plugs 130 has a step profile. In this embodiment, the step profile includes L-shape cross-sectional profiles, therefore the gate conductor layer 124 can being formed easily. More precisely, each of the L-shape cross-sectional profiles has a vertical part V1 and a horizontal part V2. Preferably, a minimum distance 11 between the vertical part V1 and the corresponding contact plug 130 is larger than a minimum distance 12 between the horizontal part V2 and the corresponding contact plug 130, to avoid short circuit from occurring caused by the gate conductor layer 124 contacting the corresponding contact plug 130. Still preferably, a height h1 of the horizontal part V2 is ¼-⅓ of a maximum height h of each of the L-shape cross-sectional profiles. For example, a ratio of a width w1 of the vertical part V1 and a width w2 of the horizontal part V2 is ⅔, to keep a distance between the gate conductor layer 124 and the corresponding contact plug 130. Hence, critical dimensions of elements are shrunk, stability of components are improved, flexible layouts are obtained, processing windows are increased, and sizes of the charge storage layers 122 are kept to preserve the charge storage ability. Besides, impurities doped into the substrate 110 right below the gate conductor layers 124 and the charge storage layers 122 while performing implant processes for forming source regions/drain regions and/or lightly doped source regions/drain regions can be avoided, to prevent performance of components from being degraded.

Figure 3:
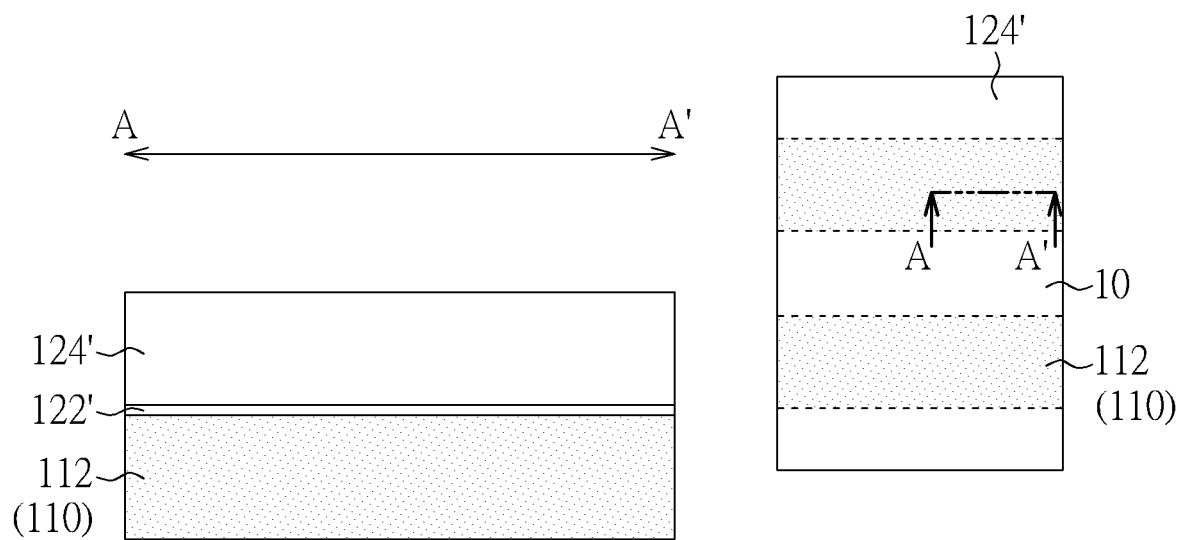
FIG. 3 schematically depicts a top view and a cross-sectional view of a non-volatile memory according to an embodiment of the present invention.

FIGS. 3-9 schematically depict top views and cross-sectional views of a non-volatile memory according to an embodiment of the present invention. For clarifying the present invention, please refer to FIGS. 1-2 at the same time. As shown in FIG. 3, the substrate 110 is provided, wherein the substrate 110 may include the plurality of diffusion strips 112 and the isolation structures 10 isolating the diffusion strips 112. For instance, recesses may be formed in a bulk substrate (not shown), an isolation material fills into the recesses to form the isolation structures 10 and define areas for forming the diffusion strips 112, and then the diffusion strips 112 are formed simultaneously or respectively by implant processes, but the present invention is not restricted thereto.

Figure 4:
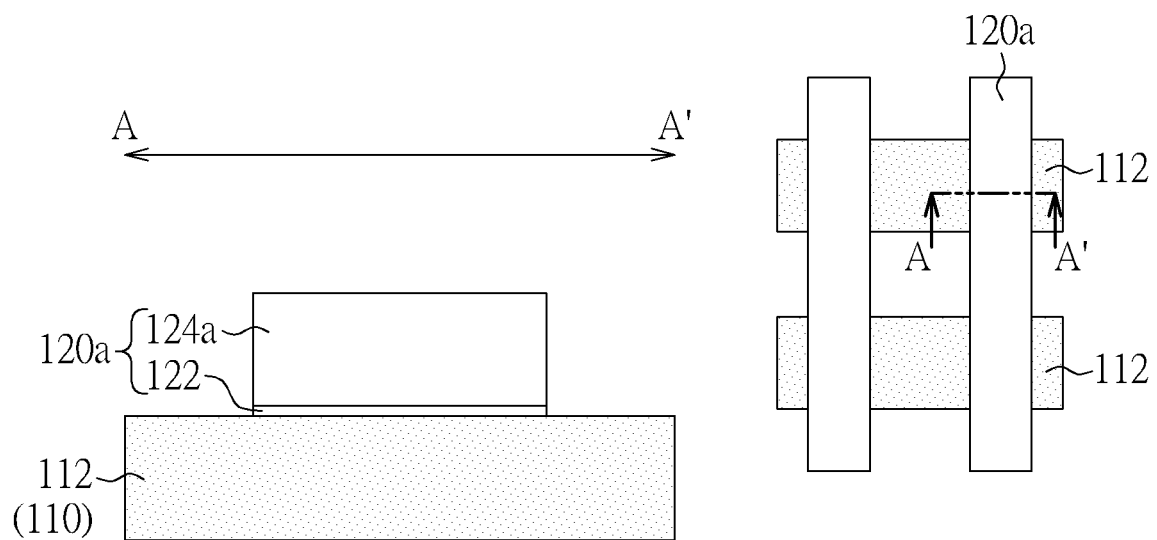
FIG. 4 schematically depicts a top view and a cross-sectional view of a non-volatile memory according to an embodiment of the present invention.

Please refer to FIGS. 3-4, patterned gate stacked strips 120a are disposed over the diffusion strips 112. Methods of forming the patterned gate stacked strips 120a may include the following steps, but it is not limited thereto. As shown in FIG. 3, a blanket charge storage layer 122' and a first conductor layer 124' are sequentially formed on the substrate 110. As shown in FIG. 4, the first conductor layer 124' and the blanket charge storage layer 122' are patterned to form the patterned gate stacked strips 120a, wherein each of the patterned gate stacked strips 120a includes the charge storage layer 122 and a first gate conductor layer 124a stacked from bottom to top. The first gate conductor layer 124a may be a polysilicon layer for forming a polysilicon gate conductor layer.

Figure 5:
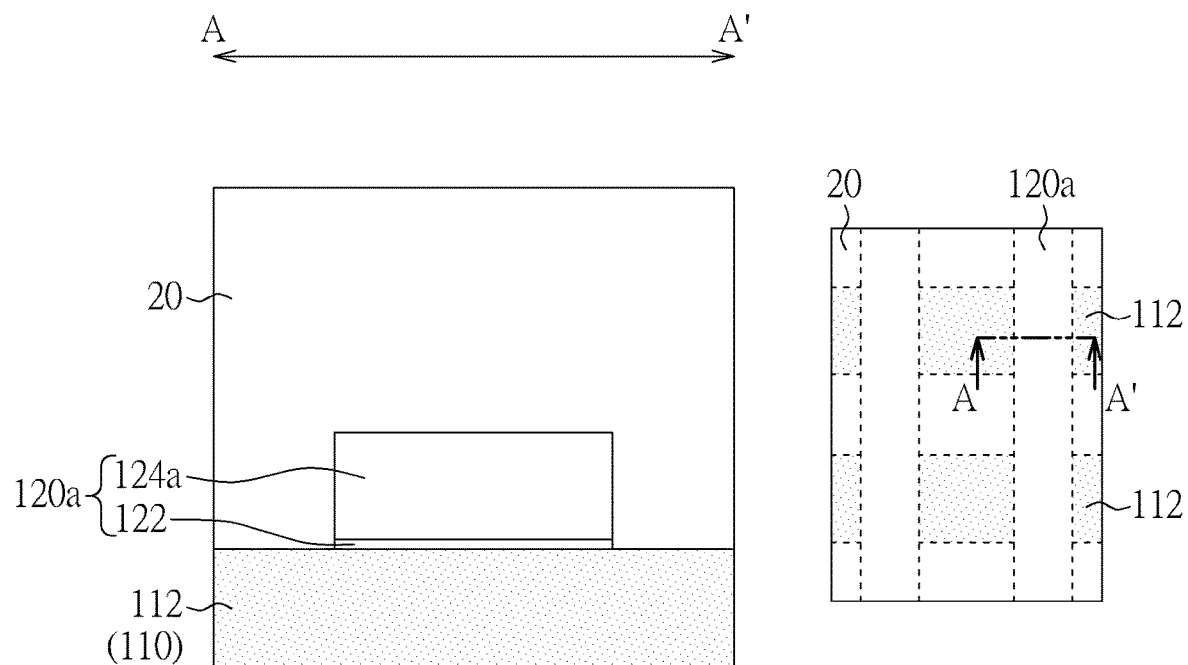
FIG. 5 schematically depicts a top view and a cross-sectional view of a non-volatile memory according to an embodiment of the present invention.
Figure 6:
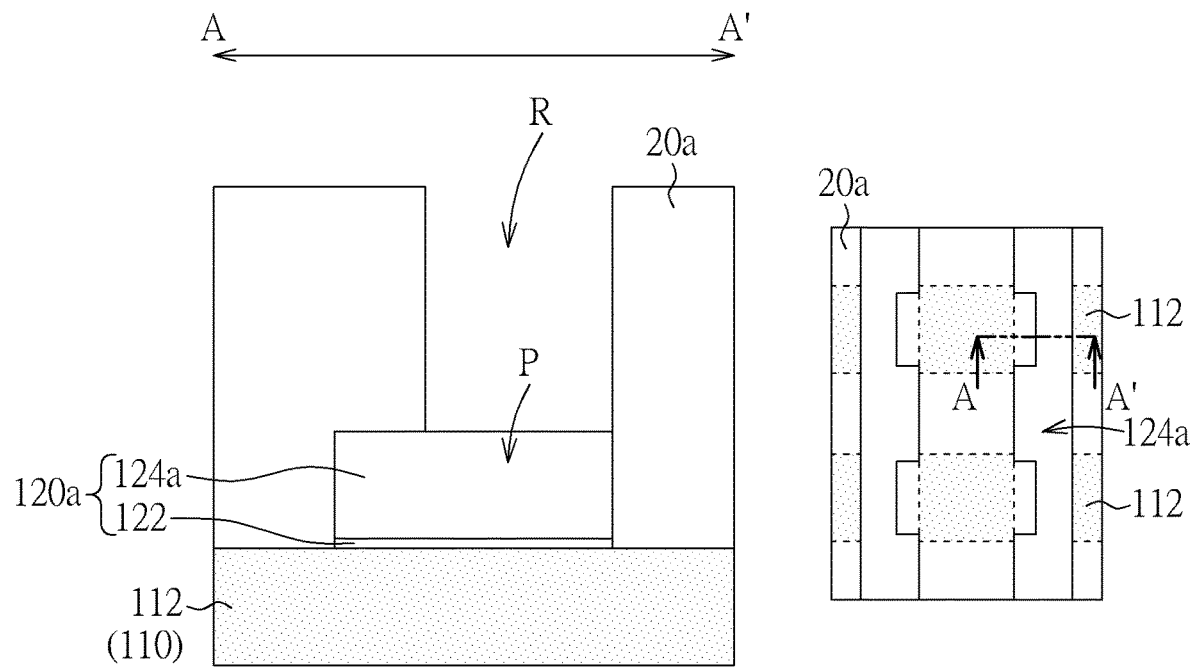
FIG. 6 schematically depicts a top view and a cross-sectional view of a non-volatile memory according to an embodiment of the present invention.

Please refer to FIGS. 5-6, a dielectric layer 20a covers the patterned gate stacked strips 120a and the substrate 110, wherein the dielectric layer 20a has recesses R, and the recesses R only expose first parts P of the first gate conductor layers 124a on the diffusion strips 112. Methods of forming the dielectric layer 20a may include the following, but it is not limited thereto. As shown in FIG. 5, a blanket dielectric layer 20 is deposited to cover the patterned gate stacked strips 120a and the substrate 110. As shown in FIG. 6, the blanket dielectric layer 20 is patterned to form the dielectric layer 20a, and the recesses R in the dielectric layer 20a, wherein the recesses R expose the first parts P of the first gate conductor layers 124a. In this embodiment, only the first parts P of the first gate conductor layers 124a are exposed, for forming gate conductor layers having L-shape cross-sectional profiles in later processes.

Figure 7:
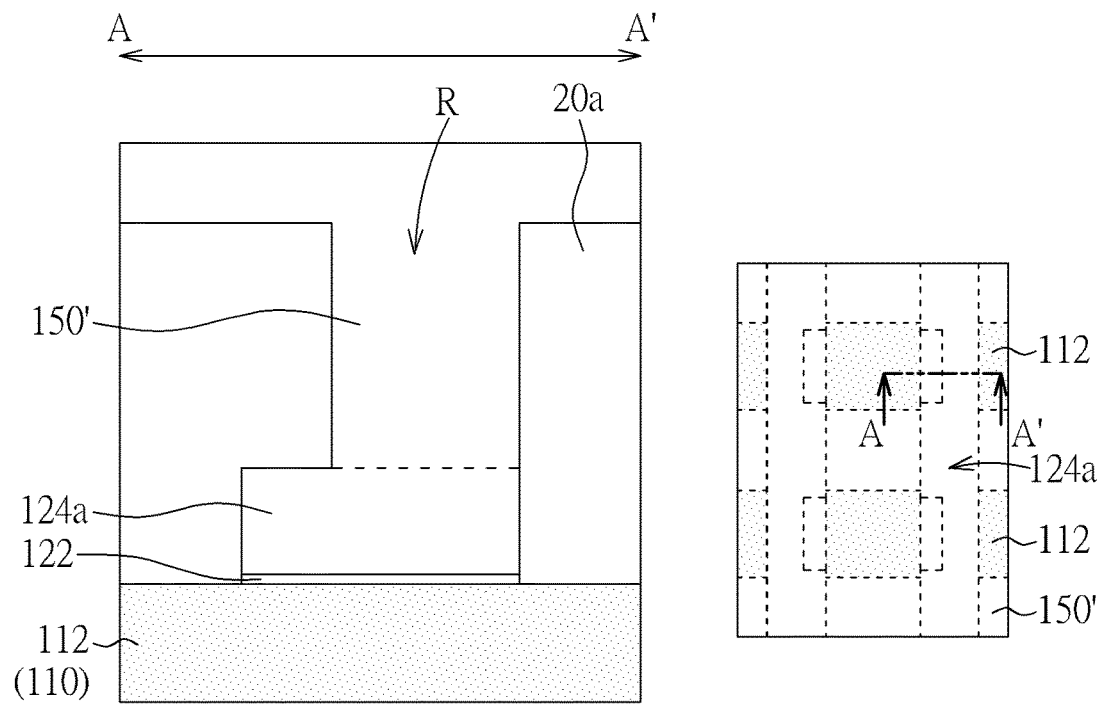
FIG. 7 schematically depicts a top view and a cross-sectional view of a non-volatile memory according to an embodiment of the present invention.
Figure 8:
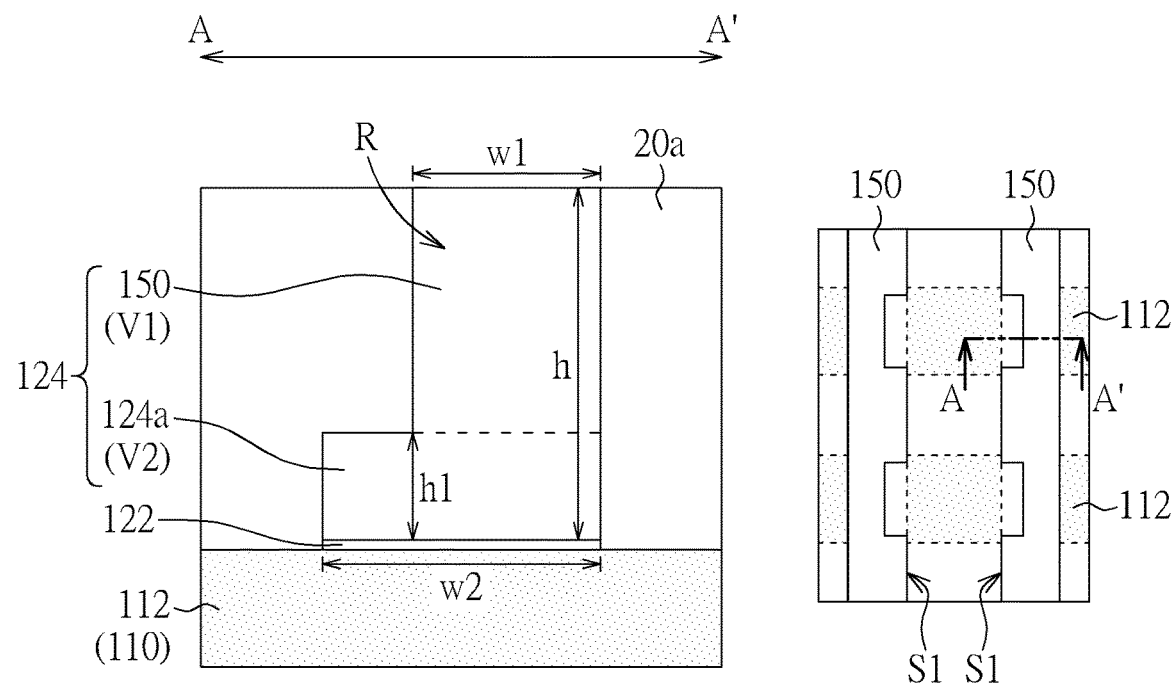
FIG. 8 schematically depicts a top view and a cross-sectional view of a non-volatile memory according to an embodiment of the present invention.

Please refer to FIGS. 7-8, second gate conductor layers 150 fill into the recesses R, to form the plurality of gate conductor layers 124, wherein the sidewall S1 of each of the gate conductor layers 124 has a step profile. Methods of filling the second gate conductor layers 150 into the recesses R may include the following steps. As shown in FIG. 7, a second conductor layer 150' is deposited into the recesses R and on the dielectric layer 20a. As shown in FIG. 8, the second conductor layer 150' exceeding from the recesses R is removed to form the second gate conductor layers 150 in the recesses R. Thus, the first gate conductor layers 124a and the second gate conductor layers 150 constitute the gate conductor layers 124, and the gate conductor layers 124 have step profiles. In one case, the first gate conductor layers 124*a* and the second gate conductor layers 150 have common materials, which may be polysilicon to form polysilicon gate conductor layers.

Above all, the step profiles have L-shape cross-sectional profiles, but it is not restricted thereto. By applying the methods of this embodiment, the vertical parts V1 of the L-shape cross-sectional profiles are the second gate conductor layers 150 while the horizontal parts V2 are the first gate conductor layers 124*a*, but it is not limited thereto. Preferably, the height h1 of each of the horizontal parts V2 is ¼-⅓ of the maximum height h of each of the L-shape cross-sectional profiles. Still preferably, a ratio of the width w1 of each of the second gate conductor layers 150 and the width w2 of each of the first gate conductor layers 124*a* is ⅔, to increase distances between the gate conductor layers 124 and the later formed contact plugs 130.

Figure 9:
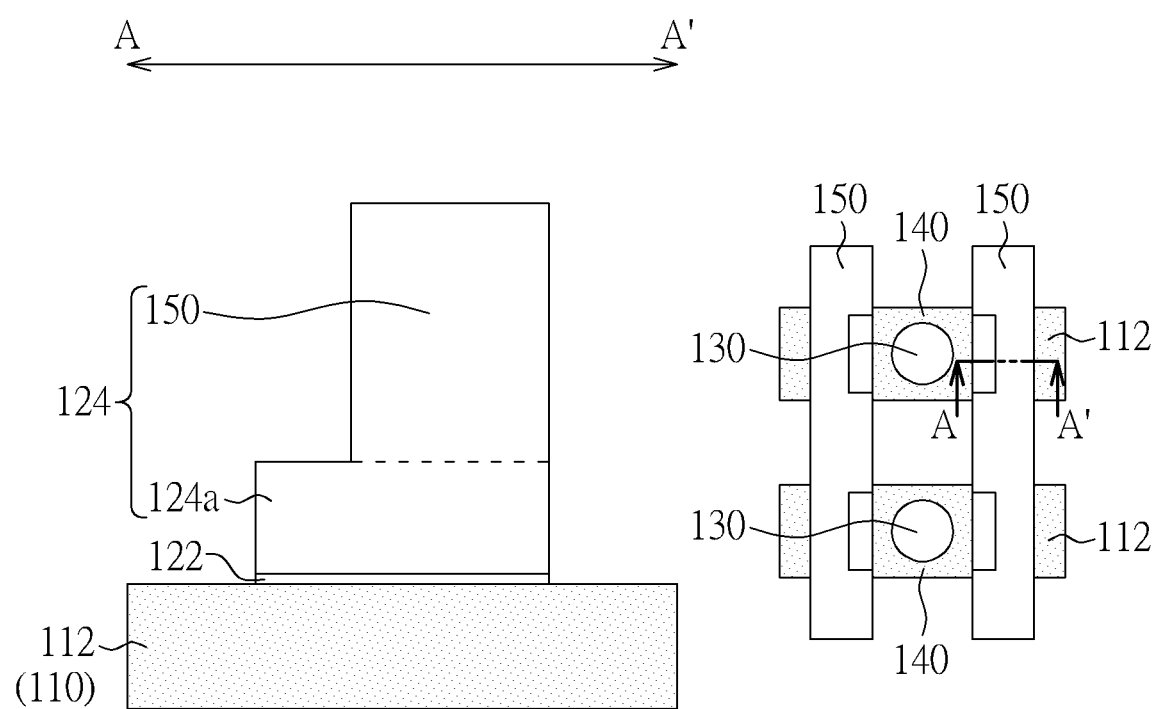
FIG. 9 schematically depicts a top view and a cross-sectional view of a non-volatile memory according to an embodiment of the present invention.

The dielectric layer 20*a* is removed, as shown in FIG. 9. Thereafter, source regions (or drain regions) 140 are formed in the diffusion strips 112, and then the plurality of contact plugs 130 are formed on the source regions (or drain regions) 140 between the gate conductor layers 124. Methods of forming the contact plugs 130 may include the following. A dielectric layer (not shown) may blanketly cover the substrate 110 between the gate conductor layers 124, the dielectric layer is etched to form contact holes in the dielectric layer, and then barrier layers (not shown) and metal (not shown) fill into the contact holes to form the contact plugs 130. The contact holes and the contact plugs 130 have taper cross-sectional profiles broaden from bottom to top, so that the contact plugs 130 can fill into the contact holes easily. For example, each of the contact plugs 130 has a cone shape, but it is not limited thereto. Then, later non-volatile memory processes are processed. These processes are not described.

To summarize, the present invention provides a non-volatile memory and forming method thereof, which provides a substrate including a plurality of diffusion strips; forms a plurality of gate stacked strips over the diffusion strips, wherein each of the gate stacked strips includes a charge storage layer and a gate conductor layer stacked from bottom to top; forms a plurality of contact plugs on the diffusion strips between the gate stacked strips, wherein a sidewall of each of the gate conductor layer on the diffusion strips and beside the contact plugs has a step profile. By doing this, distances between the contact plugs and upper parts of the gate conductor layers can be increased. Thereby, short circuits caused by the contacting of the contact plugs and the gate conductor layers can be avoided. This shrinks critical dimensions of elements, improves stability of components, has more flexible layouts and increases processing windows. Meanwhile, sizes of the charge storage layers are kept and thus charge storage capacity is preserved. Besides, impurities doped into the substrate right below the gate conductor layers and the charge storage layers while performing implant processes for forming source regions/drain regions or/and lightly doped source regions/drain regions can be avoided, to prevent performance of components from being degraded.

Moreover, the step profiles are preferably L-shape cross-sectional profiles, so that the gate conductor layers can be formed easily, wherein each of the L-shape cross-sectional profiles has a vertical part and a horizontal part. The contact plugs preferably have taper cross-sectional profiles broaden from bottom to top, enabling the contact plugs filling into contact holes easily. For instance, each of the contact plugs preferably has a cone shape. A minimum distance between the vertical part and the corresponding contact plug is larger than a minimum distance between the horizontal part and the corresponding contact plug, to prevent the gate conductor layer from contacting the corresponding contact plug.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a non-volatile memory, comprising:
   providing a substrate comprising a plurality of diffusion strips;
   forming a plurality of patterned gate stacked strips over the diffusion strips, wherein each of the patterned gate stacked strips comprises a charge storage layer and a first gate conductor layer stacked from bottom to top;
   forming a dielectric layer covering the patterned gate stacked strips and the substrate, wherein the dielectric layer has recesses exposing only first parts of the first gate conductor layers on the diffusion strips;
   filling second gate conductor layers into the recesses, to form a plurality of gate conductor layers, wherein a sidewall of each of the gate conductor layers comprises a step profile;
   removing the dielectric layer; and
   forming a plurality of contact plugs on the diffusion strips between the step profiles of the gate conductor layers.

2. The method of forming a non-volatile memory according to claim 1, wherein the steps of forming the patterned gate stacked strips comprise:
   sequentially forming a blanket charge storage layer and a first conductor layer on the substrate; and
   patterning the first conductor layer and the blanket charge storage layer to form the patterned gate stacked strips.

3. The method of forming a non-volatile memory according to claim 1, wherein the steps of removing the dielectric layer comprise:
   depositing a blanket dielectric layer covering the patterned gate stacked strips and the substrate; and
   patterning the blanket dielectric layer to form the recesses and expose the first parts of the first gate conductor layers on the diffusion strips.

4. The method of forming a non-volatile memory according to claim 1, wherein the steps of filling the second gate conductor layers into the recesses comprise:
   depositing a second conductor layer into the recesses and on the dielectric layer; and
   removing the second conductor layer exceeding from the recesses to form the second gate conductor layers into the recesses.

5. The method of forming a non-volatile memory according to claim 1, wherein the step profiles comprise L-shape cross-sectional profiles, and each of the L-shape cross-sectional profiles has a vertical part and a horizontal part.

6. The method of forming a non-volatile memory according to claim 5, wherein a height of the horizontal part is ¼-⅓ of a maximum height of each of the L-shape cross-sectional profiles.

7. The method of forming a non-volatile memory according to claim 5, wherein a ratio of a width of the vertical part and a width of the horizontal part is ⅔.

8. The method of forming a non-volatile memory according to claim 1, further comprising:

forming source regions or drain regions in the diffusion strips before the contact plugs are formed; and forming the contact plugs on the source regions or the drain regions.

9. The method of forming a non-volatile memory according to claim 1, wherein each of the contact plugs has a taper cross-sectional profile broaden from bottom to top.

* * * * *